US011234296B2

(12) United States Patent
Masunaga et al.

(10) Patent No.: US 11,234,296 B2
(45) Date of Patent: Jan. 25, 2022

(54) HEAT TREATMENT APPARATUS

(71) Applicant: Tokyo Electron Limited, Tokyo (JP)

(72) Inventors: Masayoshi Masunaga, Iwate (JP); Yutaka Sasaki, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 90 days.

(21) Appl. No.: 16/711,527

(22) Filed: Dec. 12, 2019

(65) Prior Publication Data

US 2020/0196390 A1 Jun. 18, 2020

(30) Foreign Application Priority Data

Dec. 17, 2018 (JP) .............................. JP2018-235169

(51) Int. Cl.
*H05B 3/68* (2006.01)
*H05B 1/02* (2006.01)
*H01L 21/67* (2006.01)

(52) U.S. Cl.
CPC ..... *H05B 1/0233* (2013.01); *H01L 21/67248* (2013.01)

(58) Field of Classification Search
CPC ......... H01L 21/67109; H01L 21/67248; H01L 21/67098; H01L 21/67103; H01L 21/671115; H05B 1/0233; C23C 16/003; C23C 16/448; C23C 16/4481; C23C 16/4482; C23C 16/452; C23C 16/455; C23C 16/45502–45508; C23C 16/4551; C23C 16/45512–45578; C23C 16/45587; C23C 16/45593; C23C 16/4584; C23C 16/458; C23C 16/4581; C23C 16/4582; C23C 16/4586; C23C 16/4587; C23C 16/4588; C23C 16/46; C23C 16/463; C23C 16/48; C23C 16/481; C23C 16/482
USPC ............... 219/390–398, 444.1; 392/416–421
See application file for complete search history.

(56) References Cited

U.S. PATENT DOCUMENTS

| | | | | |
|---|---|---|---|---|
| 2003/0183614 A1* | 10/2003 | Yamaguchi | ............. | C30B 31/10 219/390 |
| 2009/0203227 A1* | 8/2009 | Hasebe | ............. | H01L 21/02219 438/787 |
| 2019/0080941 A1* | 3/2019 | Kosugi | ............. | H01L 21/67109 |

FOREIGN PATENT DOCUMENTS

JP 2014-096453 A 5/2014

* cited by examiner

*Primary Examiner* — Sang Y Paik
(74) *Attorney, Agent, or Firm* — Abelman, Frayne & Schwab

(57) ABSTRACT

A heat treatment apparatus includes a processing container extended in a vertical direction; a heater provided around the processing container; a temperature sensor provided along a longitudinal direction of the processing container either in the processing container or in a space between the processing container and the heater; and a pair of first partitions provided in the space across a half line that extends from a central axis of the processing container and passes through the temperature sensor, and extending along the longitudinal direction of the processing container.

15 Claims, 16 Drawing Sheets

HEAT TREATMENT APPARATUS

CROSS-REFERENCE TO RELATED APPLICATIONS

This application is based on and claims priority from Japanese Patent Application No. 2018-235169 filed on Dec. 17, 2018 with the Japan Patent Office, the disclosure of which is incorporated herein in its entirety by reference.

TECHNICAL FIELD

The present disclosure relates to a heat treatment apparatus.

BACKGROUND

A heat treatment apparatus is known in which a ring plate formed with a circular thin-plate ring shape is provided along a circumferential direction of a processing container in a heating space between the processing container and a heater provided on the outer circumference thereof in order to suppress the occurrence of convection in the heating space (see, e.g., Japanese Patent Laid-Open Publication No. 2014-096453).

SUMMARY

A heat treatment apparatus according to an aspect of the present disclosure includes a processing container extended in a vertical direction, a heater provided around the processing container, a temperature sensor provided along a longitudinal direction of the processing container in the processing container or in a space between the processing container and the heater, and a pair of partitions provided in the space across a half line that extends from a central axis of the processing container and passes through the temperature sensor, and extending along the longitudinal direction of the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

First Embodiment (Heat Treatment Apparatus)

Figure 1:
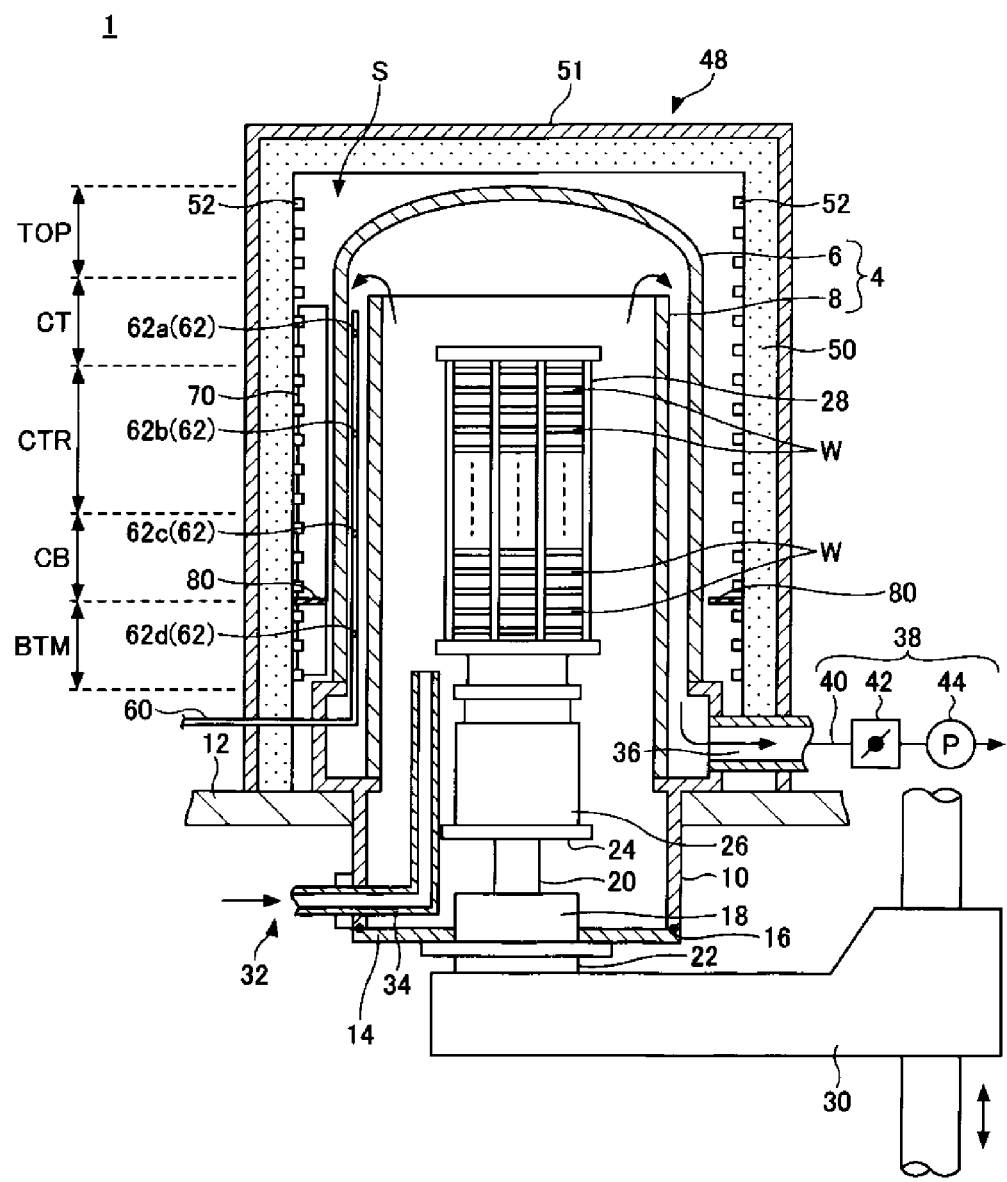
FIG. 1 is a longitudinal cross-sectional view illustrating an exemplary configuration of a heat treatment apparatus according to a first embodiment.
Figure 2:
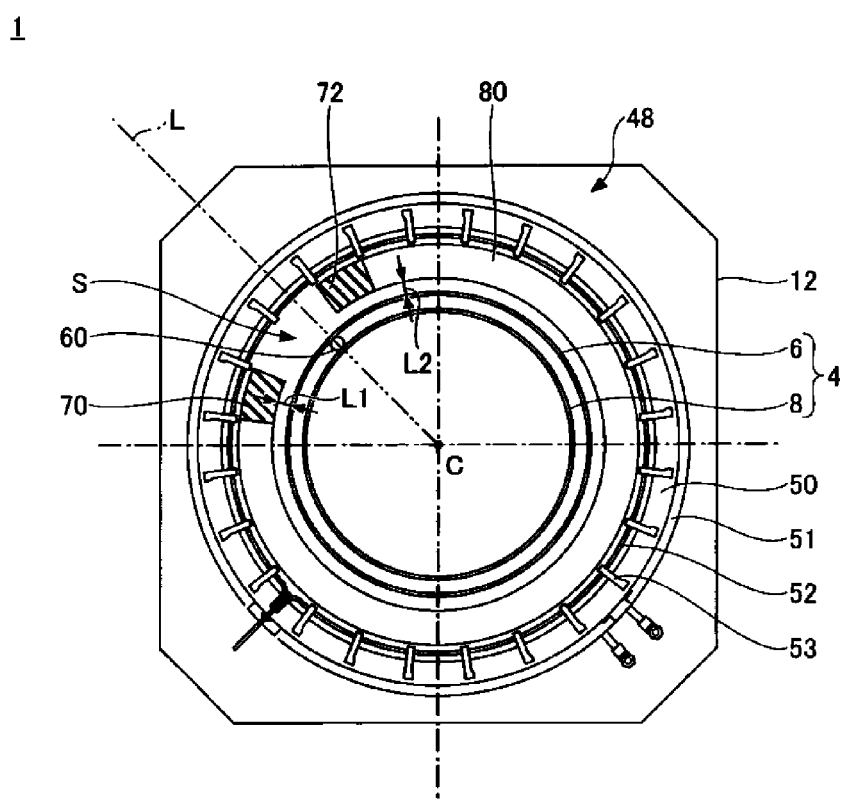
FIG. 2 is a cross-sectional view illustrating the exemplary configuration of the heat treatment apparatus according to the first embodiment.

An exemplary configuration of a heat treatment apparatus of a first embodiment will be described. The heat treatment apparatus is a batch-type vertical heat treatment apparatus that collectively performs heat treatment on a plurality of substrates. FIG. 1 is a longitudinal cross-sectional view illustrating an exemplary configuration of the heat treatment apparatus according to the first embodiment. FIG. 2 is a cross-sectional view illustrating the exemplary configuration of the heat treatment apparatus according to the first embodiment.

As illustrated in FIGS. 1 and 2, a heat treatment apparatus 1 includes a vertically extended processing container 4 of which the longitudinal direction is a vertical direction. The processing container 4 is configured as a double tube structure that has an outer tube 6 having a ceiling, and a cylindrical-shaped inner tube 8 concentrically arranged inside the outer tube 6.

The outer tube 6 and the inner tube 8 are made of a heat-resistant material such as quartz or silicon carbide. Lower end portions of the outer tube 6 and the inner tube 8 are held by a manifold 10 made of, for example, stainless steel. The manifold 10 is fixed to a base plate 12. The entire processing container 4 may be made of, for example, quartz, without providing the manifold 10.

A disc-shaped cap portion 14 made of, for example, stainless steel is attached to an opening at a lower end portion of the manifold 10 so as to be air-tightly sealable via a seal member 16. A rotating shaft 20 is inserted through a substantially central portion of the cap portion 14, and is rotatable in an air-tight state by, for example, a magnetic fluid seal 18. A lower end portion of the rotating shaft 20 is connected to a rotating mechanism 22. A table 24 made of, for example, stainless steel is fixed to an upper end of the rotating shaft 20.

A heat reserving tube 26 made of, for example, quartz is provided on the table 24. A wafer boat 28 made of, for example, quartz is placed on the heat reserving tube 26.

In the wafer boat 28, a plurality of (e.g., 50 to 150) semiconductor wafers (hereinafter, referred to as "wafers W") are accommodated at predetermined intervals (e.g., at pitches of about 10 mm). The wafer boat 28, the heat reserving tube 26, the table 24, and the cap portion 14 are integrally loaded into/unloaded from the processing container 4 by a lifting mechanism 30 which is, for example, a boat elevator.

A gas introducing unit 32 configured to introduce a processing gas into the processing container 4 is provided at a lower portion of the manifold 10. The gas introducing unit 32 includes a gas nozzle 34 provided to air-tightly penetrate the manifold 10. Although FIG. 1 illustrates a case where one gas introducing unit 32 is provided, a plurality of gas introducing units 32 may be provided according to, for example, the number of gas types to be used. A flow rate of the gas introduced from the gas nozzle 34 to the processing container 4 is controlled by a flow rate control mechanism (not illustrated).

A gas outlet 36 is provided in the upper portion of the manifold 10. An exhaust system 38 is connected to the gas outlet 36. The exhaust system 38 includes an exhaust passage 40 connected to the gas outlet 36, and a pressure regulating valve 42 and a vacuum pump 44 which are interposed in the middle of the exhaust passage 40. By the exhaust system 38, it is possible to exhaust the processing container 4 while adjusting the pressure therein.

Around the processing container 4, a heater 48 configured to heat wafers W is provided to surround the processing container 4. The heater 48 includes a heat insulating member 50, a protective cover 51, a heater element 52, and a holding member 53.

The heat insulating member 50 has a ceiling surface, and is formed in a cylindrical shape that is opened at its lower end portion. The lower end portion of the heat insulating member 50 is supported by the base plate 12. The heat insulating member 50 is made of, for example, a mixture of alumina and amorphous silica that has a low thermal conductivity, and is soft. The heat insulating member 50 is disposed such that the inner circumference thereof is spaced apart from the outer surface of the processing container 4 by a predetermined distance. The predetermined distance is, for example, 62 mm to 70 mm.

The protective cover 51 is attached to cover the entire surface of the outer circumference of the heat insulating member 50. The protective cover 51 is made of, for example, stainless steel.

The heater element 52 is disposed to be spirally wound on the inner circumferential side of the heat insulating member 50. The heater element 52 is held by the holding member 53 to be capable of thermal expansion and thermal contraction, with a predetermined gap from the inner surface of the heat insulating member 50. A spiral groove portion may be formed on the inner circumferential side of the heat insulating member 50, and the heater element 52 may be fitted into the groove portion to be fixed, instead of being held by the holding member 53. As a material of the heater element 52, for example, a resistant heat generating element may be used. The heater element 52 is connected to a power supply, generates heat when power is supplied, and heats the wafers W held by the wafer boat 28. The heater element 52 is divided into a plurality of heating areas (e.g., zones) in the vertical direction. Accordingly, when the heater element 52 is divided into the plurality of heating areas in the vertical direction, it is possible to adjust the temperature of the processing container 4 in the vertical direction by controlling the amount of heat generated by the heater element 52 for each heating area. In the example in FIG. 1, the plurality of heating areas include an area TOP, an area CT, an area CTR, an area CB, and an area RTM, provided from above toward below. The heater element 52 may form a single heating area without being divided into a plurality of heating areas.

The holding member 53 extends, on the inner surface of the heat insulating member 50, in the axial direction of the heat insulating member 50, and is provided at a predetermined interval in the circumferential direction. The holding member 53 holds the heater element 52 to be capable of thermal expansion and thermal contraction.

A temperature sensor 60 is provided along the longitudinal direction of the processing container 4, within the processing container 4. The temperature sensor 60 is, for example, a thermocouple having a plurality of temperature measuring units 62 along the longitudinal direction of the processing container 4. In the example in FIG. 1, the temperature measuring units 62a, 62b, 62c, and 62d are disposed in each of the area CT, the area CTR, the area CB, and the area BTM. Therefore, it is possible to individually measure the temperature of the area CT, the area CTR, the area CB, and the area BTM. The arrangement of the temperature measuring unit 62 is not limited thereto. Further, the temperature sensor 60 may be provided in a space S between the processing container 4 and the heater 48.

As illustrated in FIG. 2, a pair of partitions 70 and 72 across a half line L that extends from a central axis C of the processing container 4 and passes through the temperature sensor 60, and extending along the longitudinal direction of the processing container 4 are provided in the space S between the processing container 4 and the heater 48. As illustrated in FIG. 1, an upper end of the first partition 70 may be positioned above the uppermost temperature measuring unit 62a among the plurality of temperature measuring units 62 of the temperature sensor 60. Similarly to the first partition 70, an upper end of the first partition 72 may be positioned above the uppermost temperature measuring unit 62a among the plurality of temperature measuring units 62 of the temperature sensor 60.

The first partitions 70 and 72 are detachably attached to, for example, the heater element 52 or the holding member 53. The first partitions 70 and 72 may be attached to other members. Further, the first partitions 70 and 72 are provided with a predetermined gap L1 with respect to the outer surface of the outer tube 6 of the processing container 4. The predetermined gap L1 is, for example, 7 mm to 15 mm.

The first partitions 70 and 72 are made of, for example, a ceramic material such as alumina $Al_2O_3$ or aluminum nitride AlN. The first partitions 70 and 72 may be ceramic molded members molded into a block shape, respectively, or may be a fibrous member such as alumina cloth. Further, the member in which these are combined may be used. Accordingly, the first partitions 70 and 72 may be formed of a single member, or may be formed of a member divisible into a plurality of parts.

As illustrated in FIG. 2, a circular arc plate-like second partition 80 that is equal to or larger than a semicircle and extends along the circumferential direction of the processing container 4 from the first partition 70 one side to the first partition 72 at the other side is provided in the space S between the processing container 4 and the heater 48. That is, the second partition 80 is provided so as not to pass through the half line L that extends outward from the central axis C of the processing container 4 and passes through the temperature sensor 60.

The second partition 80 is detachably attached to, for example, the heater element 52 or the holding member 53. The second partition 80 may be attached to other members, for example, the first partitions 70 and 72. Further, the second partition 80 is provided with a predetermined gap L2 with respect to the outer surface of the outer tube 6 of the processing container 4. The predetermined gap L2 is, for example, 7 mm to 15 mm.

For example, as illustrated in FIG. 1, the second partition 80 is provided at or in the vicinity of a boundary between the area BTM that is the lowermost heating area among the plurality of heating areas and the area CB adjacent above the area BTM. The vicinity of the boundary between the area BTM and the area CB refers to a range closer to the area CB side than the intermediate position in the vertical direction of the area BTM, and a range closer to the area BTM side than the intermediate position in the vertical direction of the area CB.

Further, a plurality of second partitions 80 may be provided corresponding to each boundary of the plurality of heating areas or to the vicinity of the boundary. In this case, the second partition 80 may be provided any one place of the boundary of two adjacent heating areas or the vicinity of the boundary, and may be provided in a plurality of places.

The second partition 80 is made of, for example, a ceramic material such as alumina ($Al_2O_3$) or aluminum nitride (AlN). The second partition 80 may be a molded member molded into a block shape, respectively, or may be a fibrous member such as alumina cloth. Further, the member in which these are combined may be used. Accordingly, the second partition 80 may be formed of a single member, or may be formed of a member divisible into a plurality of parts. The second partition 80 may not be provided.

(Effect)

Effect produced by the heat treatment apparatus 1 of the first embodiment will be described.

Figure 3:
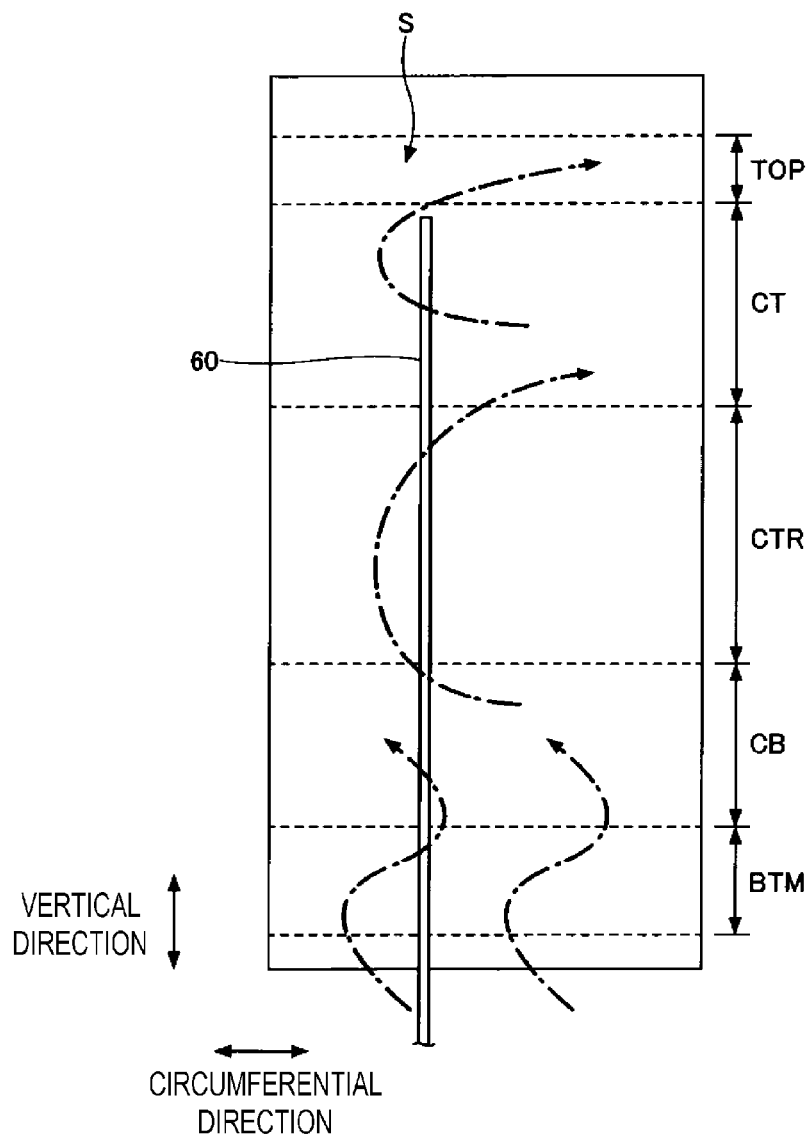
FIG. 3 is a view for explaining convection occurring in a space between a processing container and a heater of a heat treatment apparatus of the related art.

First, the heat treatment apparatus of the related art will be described. The heat treatment apparatus of the related art is an apparatus in which the first partitions 70 and 72 and the second partition 80 in the heat treatment apparatus 1 in FIG. 1 are not provided. Other configurations are the same as those of the heat treatment apparatus 1. FIG. 3 is a view for explaining convection occurring in the space S between the processing container 4 and the heater 48 of the heat treatment apparatus of the related art, and a schematic view when viewed the direction of the space S from the central axis C of the processing container 4. Further, the convection is illustrated by a dashed-dotted arrow in FIG. 3.

As illustrated in FIG. 3, in the heat treatment apparatus of the related art, convection flowing in the vertical direction occurs in the space S while meandering along the circumferential direction of the processing container 4. As a result, due to the convection, the thermal uniformity in the cross-sectional direction or the height direction of the processing container 4 is deteriorated, and thus, there is a problem that the in-plane uniformity or the inter-surface uniformity of the heat treatment is deteriorated. Further, the convection may exhibit different aspects each time the wafer is subjected to the heat treatment (for each run). Since the aspects of the heat treatment for each run are different, the reproducibility of the heat treatment is lowered.

Particularly, the temperature in the vicinity of the heat reserving tube 26 that supports the lower portion of the wafer boat 28 tends to be relatively low, and the atmospheric temperature in the loading area which is a wafer transfer space positioned below the processing container 4 is relatively low. As a result, in order to secure the thermal uniformity, more power is supplied to the heater in the area BTM that is the heating area positioned in the lower portion of the processing container 4 than the heater in other heating area. As a result, the heater itself in the area BTM becomes higher in temperature than the heater itself in other heating area, and thus, the convection described above is likely to occur in the area BTM in the space S.

Figure 4:
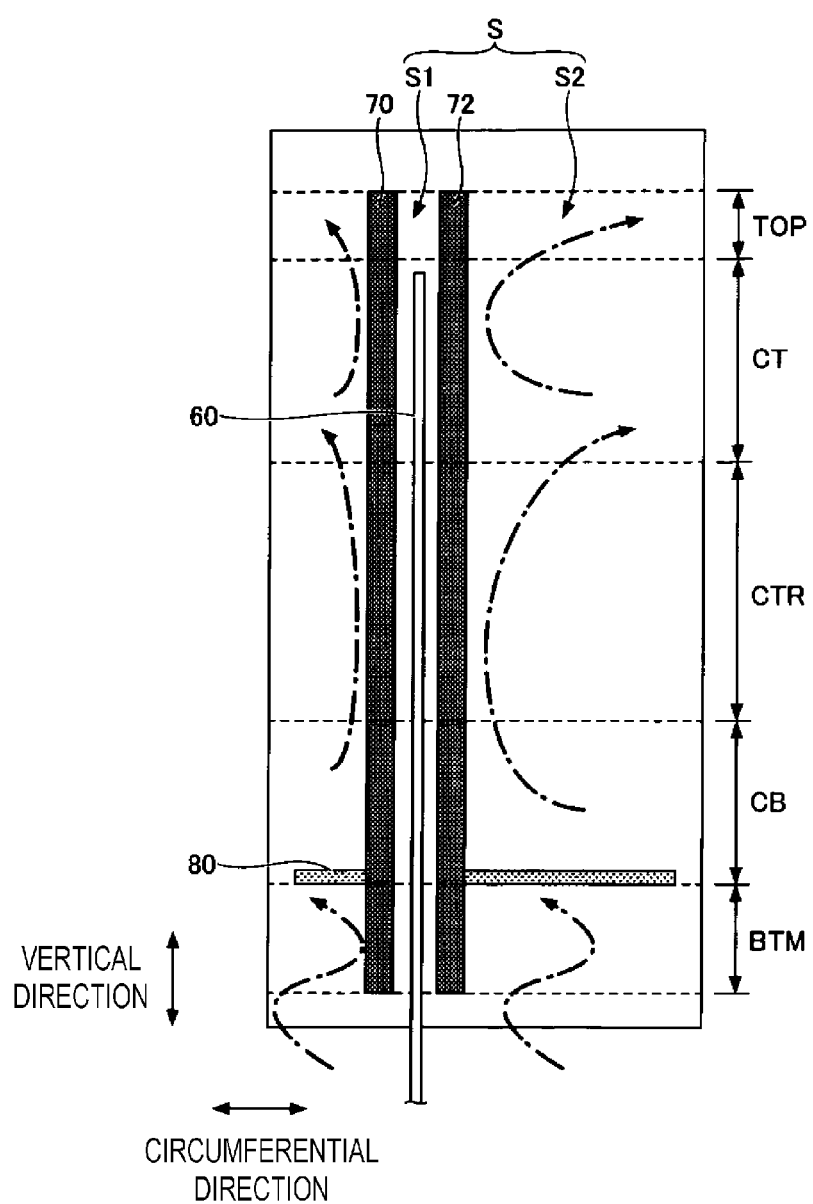
FIG. 4 is a view for explaining convection occurring in a space between a processing container and a heater of a heat treatment apparatus in FIG. 1.

Subsequently, the heat treatment apparatus 1 will be described. FIG. 4 is a view for explaining convection occurring in the space S between the processing container 4 and the heater 48 of the heat treatment apparatus 1, and a schematic view when viewed the direction of the space S from the central axis C of the processing container 4. Further, the convection is illustrated by a dashed-dotted arrow in FIG. 4.

As described above, the heat treatment apparatus 1 includes the pair of partitions 70 and 72 provided in the space S across the half line L that extends from the central axis C of the processing container 4 and passes through the temperature sensor 60, and extending along the longitudinal direction of the processing container 4. Therefore, as illustrated in FIG. 4, the space S is defined to a first space 51 corresponding to the position where the temperature sensor 60 is provided, and the second space S2 excluding the first space 51 by the first partitions 70 and 72. As a result, even when change in convection occurs for each run in the second space S2, the influence of the change in convection hardly affects the first space 51. As a result, the aspect of the heat treatment for each run becomes substantially the same, and the reproducibility of the heat treatment is improved.

Further, the heat treatment apparatus 1 includes the circular arc plate-like second partition 80 that is equal to or larger than a semicircle and extends along the circumferential direction of the processing container 4 from the first partition 70 one side to the first partition 72 at the other side at the boundary between the area BTM and the area CB in the space S. Therefore, as illustrated in FIG. 4, the convection occurring in the area BTM is suppressed from being transmitted to the area CB, the area CTR, the area CT, and the area TOP which are areas above the area BTM. As a result, even when change in convection occurs for each run in BTM area, the influence of the change in convection hardly affects the area CB, the area CTR, the area CT, and the area TOP. As a result, the aspect of the heat treatment for each run becomes substantially the same, and the reproducibility of the heat treatment is improved.

Second Embodiment (Heat Treatment Apparatus)

Figure 5:
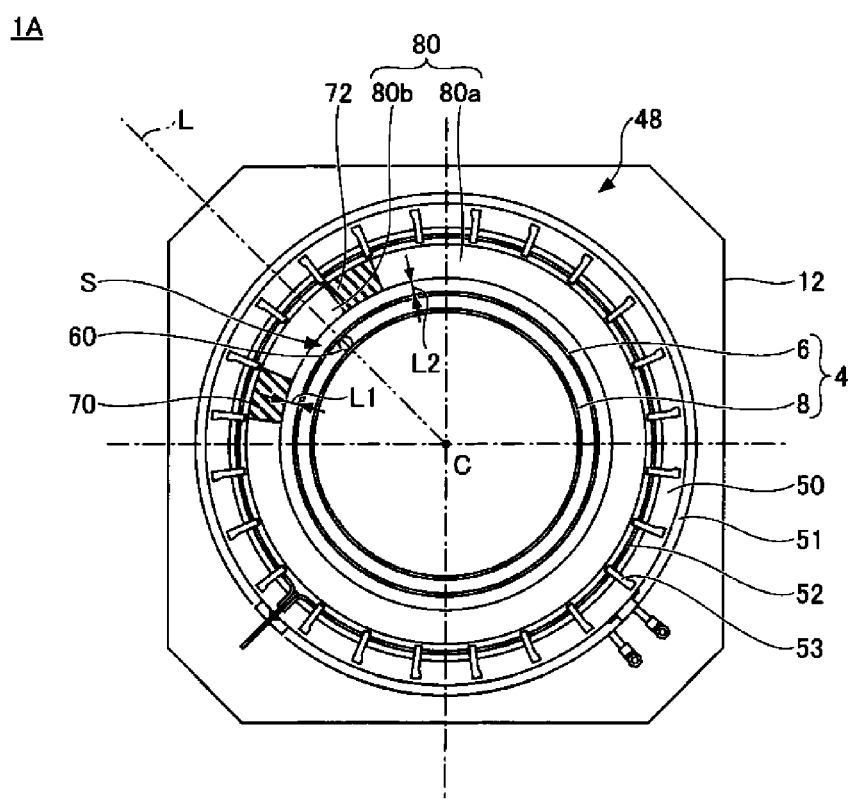
FIG. 5 is a cross-sectional view illustrating an exemplary configuration of a heat treatment apparatus according to a second embodiment.

An exemplary configuration of a heat treatment apparatus of a second embodiment will be described. FIG. 5 is a cross-sectional view illustrating the exemplary configuration of the heat treatment apparatus according to the second embodiment.

As illustrated in FIG. 5, the second partition 80 of a heat treatment apparatus 1A includes a first part 80a and a second part 80b.

The first part 80a is a circular arc plate-like part that is equal to or larger than a semicircle and extends along the circumferential direction of the processing container 4 from the first partition 70 at one side to the first partition 72 at the other side. That is, the first part 80a is provided so as not to pass through the half line L that extends outward from the central axis C of the processing container 4 and passing through the temperature sensor 60.

The second part 80b is a circular arc plate-like part that is smaller than a semicircle and extends along the circumferential direction of the processing container 4 from the first partition 70 at one side to the first partition 72 at the other side. That is, the second part 80b is provided so as to pass through the half line L that extends outward from the central axis C of the processing container 4 and passing through the temperature sensor 60.

Other configurations are the same as those of the heat treatment apparatus 1 of the first embodiment.

(Effect)

Figure 6:
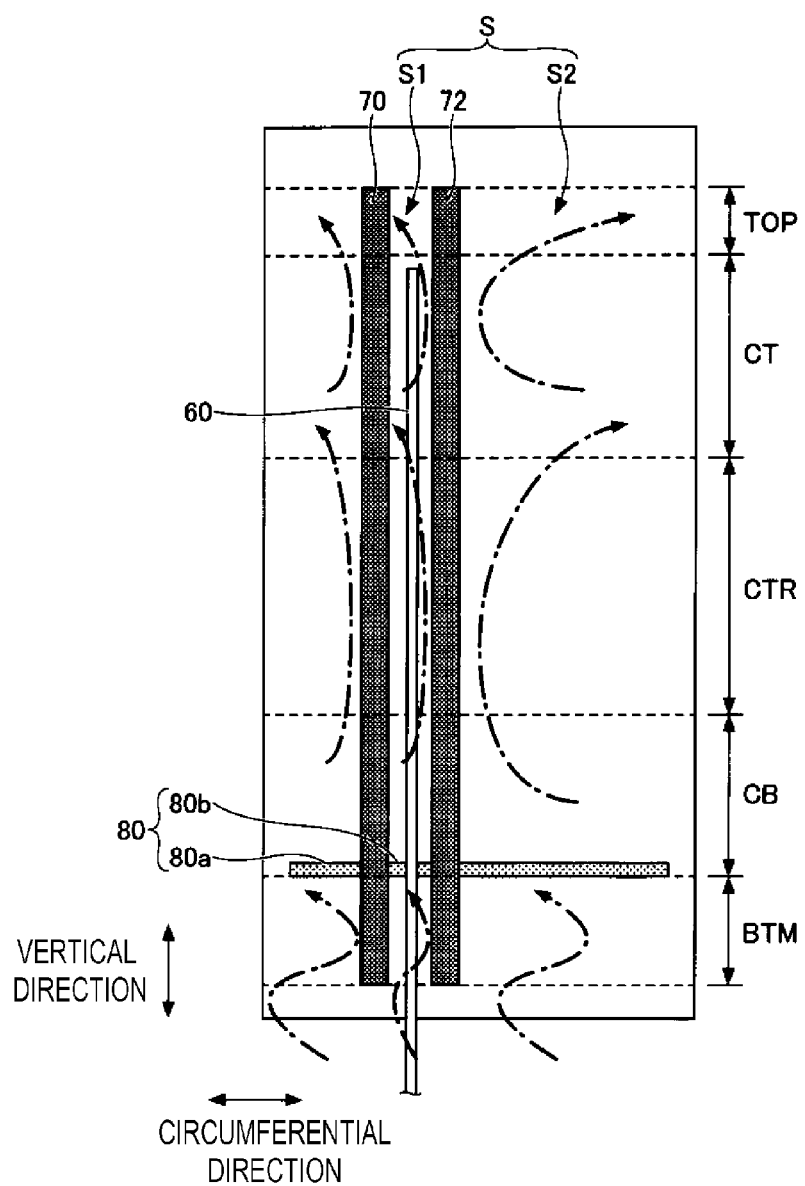
FIG. 6 is a view for explaining convection occurring in a space between a processing container and a heater of a heat treatment apparatus in FIG. 5.

Effect produced by the heat treatment apparatus 1A of the second embodiment will be described. FIG. 6 is a view for explaining convection occurring in the space S between the processing container 4 and the heater 48 of the heat treatment apparatus 1A in FIG. 5, and a schematic view when viewed the direction of the space S from the central axis C of the processing container 4. Further, the convection is illustrated by a dashed-dotted arrow in FIG. 6.

As described above, the heat treatment apparatus 1A is provided with the pair of partitions 70 and 72 provided in the space S across the half line L that extends from the central axis C of the processing container 4 and passes through the temperature sensor 60, and extending along the longitudinal direction of the processing container 4, Therefore, as illustrated in FIG. 6, the space S is defined to a first space S1 corresponding to the position where the temperature sensor 60 is provided, and the second space S2 excluding the first space 51 by the first partitions 70 and 72. As a result, even when change in convection occurs for each run in the second space S2, the influence of the change in convection hardly affects the first space S1. As a result, the aspect of the heat treatment for each run becomes substantially the same, and the reproducibility of the heat treatment is improved.

Further, the heat treatment apparatus 1A is provided with the second partition 80 including the first part 80a and the second part 80b extending along the circumferential direction of the processing container 4 from the first partition 70 at one side to the first partition 72 at the other side, at the boundary between the area BTM and the area CB in the space S. Therefore, as illustrated in FIG. 6, the convection occurring in the area BTM is suppressed from being transmitted to the area CB, the area CTR, the area CT, and the area TOP which are areas above the area BTM. As a result, even when change in convection occurs for each run in the area BTM, the influence of the change in convection hardly affects the area CB, the area CTR, the area CT, and the area TOP. As a result, the aspect of the heat treatment for each run becomes substantially the same, and the reproducibility of the heat treatment is improved.

Third Embodiment (Heat Treatment Apparatus)

Figure 7:
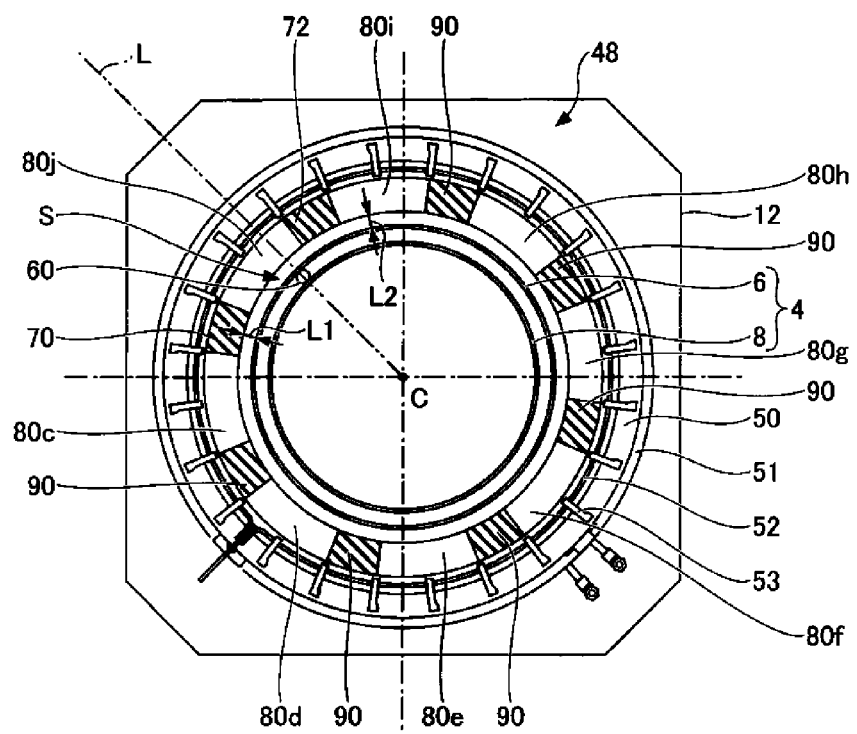
FIG. 7 is a cross-sectional view illustrating an exemplary configuration of a heat treatment apparatus according to a third embodiment.

An exemplary configuration of a heat treatment apparatus of a third embodiment will be described. FIG. 7 is a longitudinal cross-sectional view illustrating the exemplary configuration of the heat treatment apparatus according to the third embodiment.

As illustrated in FIG. 7, a heat treatment apparatus 1B of the third embodiment includes one or a plurality of third partitions 90 that are provided at a distance from the pair of first partitions 70 and 72, and extend in the longitudinal direction of the processing container 4, on the same circumference as the pair of first partitions 70 and 72. As an example, a case where six third partitions 90 are provided is illustrated in FIG. 7.

The second partition 80 includes a plurality of circular arc parts 80c, 80d, 80e, 80f, 80g, 80h, 80i, and 80j extending along the circumferential direction of the processing container 4 to connect the pair of first partitions 70 and 72 and the plurality of third partitions 90. The circular arc part 80c is formed to connect the first partition 70 and the third partition 90 adjacent to the first partition 70. The circular arc parts 80d, 80e, 80f, 80g, and 80h are formed to connect the adjacent third partitions 90. The circular arc part 80i is formed to connect the first partition 72 and the third partition 90 adjacent to the first partition 72. The circular arc part 80j is formed to connect the first partition 70 and the first partition 72.

Other configurations are the same as those of the heat treatment apparatus 1 of the first embodiment.

(Effect)

Figure 8:
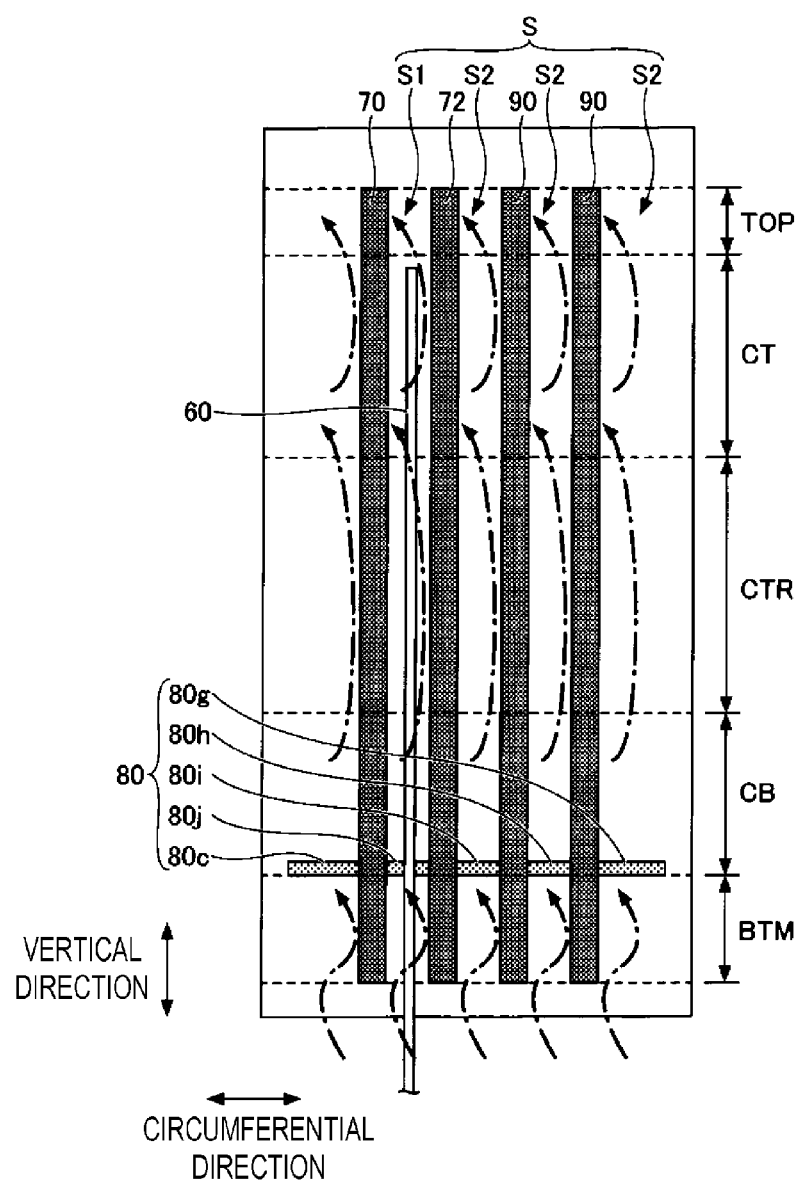
FIG. 8 is a view for explaining convection occurring in a space between a processing container and a heater of a heat treatment apparatus in FIG. 7.

Effect produced by the heat treatment apparatus 1B of the third embodiment will be described. FIG. 8 is a view for explaining convection occurring in the space S between the processing container 4 and the heater 48 of the heat treatment apparatus 1B in FIG. 7, and a schematic view when viewed the direction of the space S from the central axis C of the processing container 4. Further, the convection is illustrated by a dashed-dotted arrow in FIG. 8.

As described above, the heat treatment apparatus 1B is provided with the pair of partitions 70 and 72 provided in the space S across the half line L that extends from the central axis C of the processing container 4 and passes through the temperature sensor 60, and extending along the longitudinal direction of the processing container 4. Therefore, as illustrated in FIG. 8, the space S is defined to a first space 51 corresponding to the position where the temperature sensor 60 is provided, and the second space S2 excluding the first space 51 by the first partitions 70 and 72. As a result, even when change in convection occurs for each run in the second space S2, the influence of the change in convection hardly affects the first space 51. As a result, the aspect of the heat treatment for each run becomes substantially the same, and the reproducibility of the heat treatment is improved.

Further, the heat treatment apparatus 1B of the third embodiment includes the plurality of third partitions 90 that are provided at a distance from the pair of first partitions 70 and 72, and extend in the longitudinal direction of the processing container 4, on the same circumference as the pair of first partitions 70 and 72. Therefore, it is possible to selectively divide the temperature distribution generated in the circumference direction of the processing container 4 in the space S. As a result, it is possible to suppress the convection in the circumferential direction occurring due to the difference in the temperature distribution in the circumferential direction of the processing container 4. As a result, the aspect of the heat treatment for each run becomes substantially the same, and the reproducibility of the heat treatment is improved.

Further, the heat treatment apparatus 1B is provided with the second partition 80 including the plurality of circular arc plate-like parts 80c to 80j that connect the pair of first partitions 70 and 72 and the plurality of third partitions 90, at the boundary between the area BTM and the area CB in the space S. Therefore, as illustrated in FIG. 8, the convection occurring in the area BTM is suppressed from being transmitted to the area CB, the area CTR, the area CT, and the area TOP which are areas above the area BTM. As a result, even when change in convection occurs for each run in the area BTM, the influence of the change in convection hardly affects the area CB, the area CTR, the area CT, and the area TOP. As a result, the aspect of the heat treatment for each run becomes substantially the same, and the reproducibility of the heat treatment is improved.

EXAMPLE

Subsequently, an example for confirming the effect produced by the heat treatment apparatus 1 will be described.

Example 1

In Example 1, evaluation is made on temperature fluctuation when a first heat treatment performed at a constant temperature is repeatedly performed by 20 runs. The heat treatment apparatuses used in Example 1 include a heat treatment apparatus which does not have the first partitions 70 and 72 and the second partition 80, a heat treatment apparatus which has the first partitions 70 and 72 and a heat treatment apparatus which has the first partitions 70 and 72 and the second partition 80.

Figure 9:
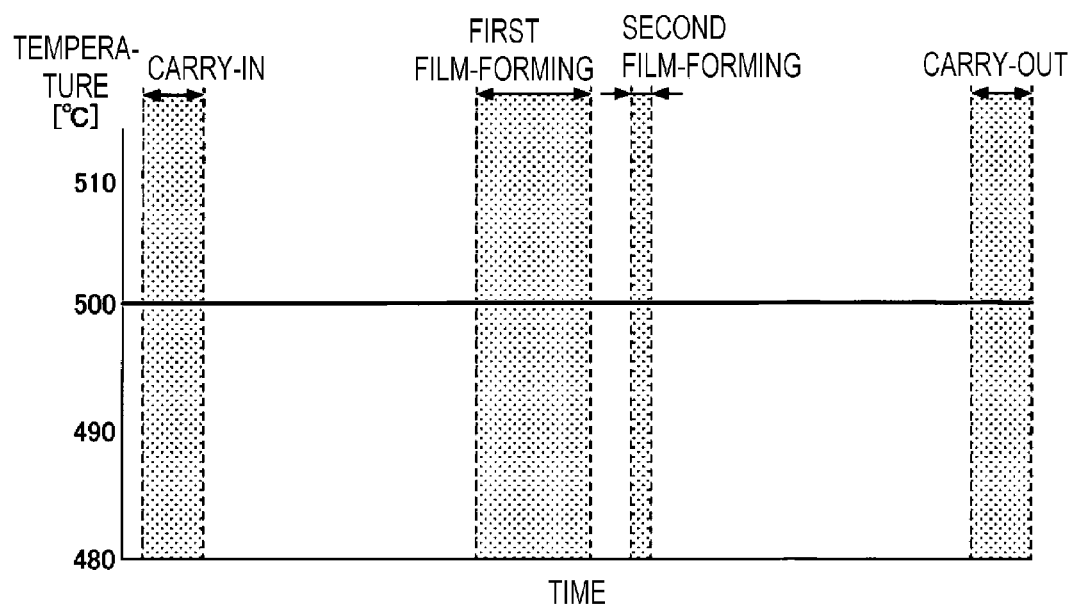
FIG. 9 is a view illustrating a change over time in a set temperature of a first heat treatment performed at a constant temperature.

FIG. 9 is a view illustrating a change over time in a set temperature of the first heat treatment performed at the constant temperature. In FIG. 9, time is illustrated on the horizontal axis, and temperature [□] is illustrated on the vertical axis. As illustrated in FIG. 9, in Example 1, the set temperature is set to 500□ in a carry-in step in which a wafer W is carried into the processing container 4, a first film-forming step and a second film-forming step in which film-forming is performed on the wafer W, and a carry-out step in which the wafer W is carried out from the processing container 4.

Figure 10A:
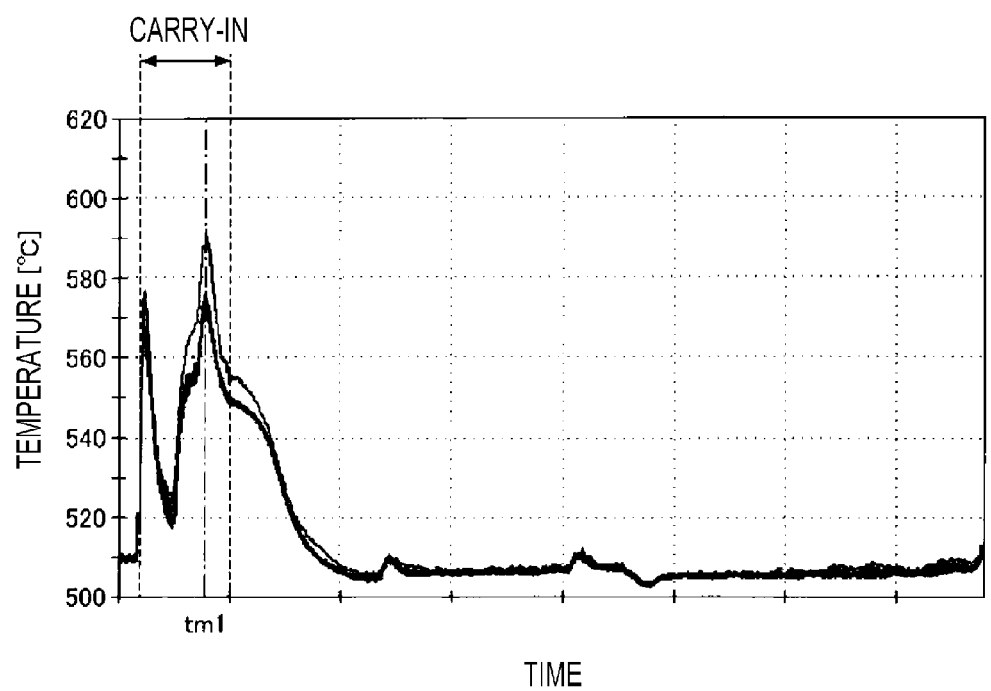
FIGS. 10A and 10B are views illustrating temperature reproducibility of the first heat treatment by the heat treatment apparatus of the related art.
Figure 10B:
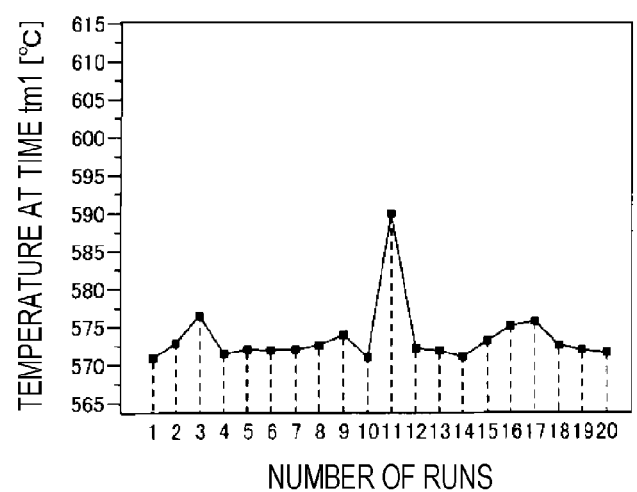

FIGS. 10A and 10B are views illustrating temperature reproducibility of the first heat treatment by the heat treatment apparatus of the related art. FIG. 10A is a graph which illustrates a change over time in the measured temperature in the area CB in the space S, and time is illustrated on the horizontal axis, and temperature [□] is illustrated on the vertical axis. FIG. 10B is a graph which illustrates a change over each run in the measured temperature at time tm1 in FIG. 10A, and the number of runs is illustrated on the horizontal axis, and temperature [□] at time tm1 is illustrated on the vertical axis. Further, a plurality of solid lines in FIG. 10A illustrate the result for each run.

As illustrated in FIG. 10A, when the first heat treatment is performed using the heat treatment apparatus of the related art, it can be seen that the temperature fluctuation occurs at each run in the carry-in step. Further, as illustrated in FIG. 10B, when the first heat treatment is performed using the heat treatment apparatus of the related art, it can be seen that the temperature at time tm1 slightly fluctuates at each run, and particularly, the temperature at 11th run fluctuates largely.

Figure 11A:
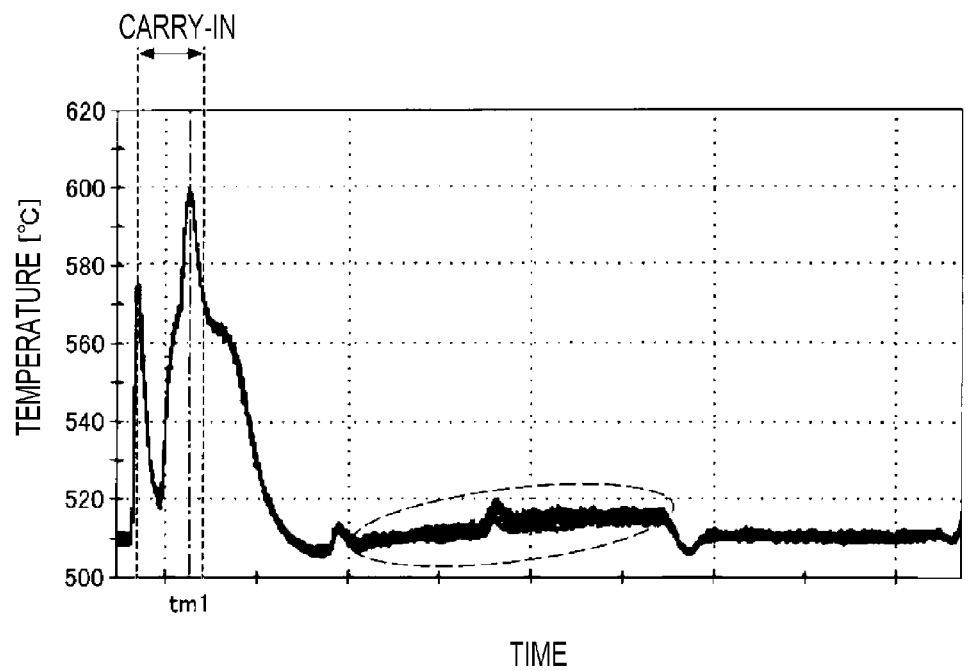
FIGS. 11A and 11B are views illustrating temperature reproducibility of the first heat treatment by a heat treatment apparatus having a first partition.
Figure 11B:
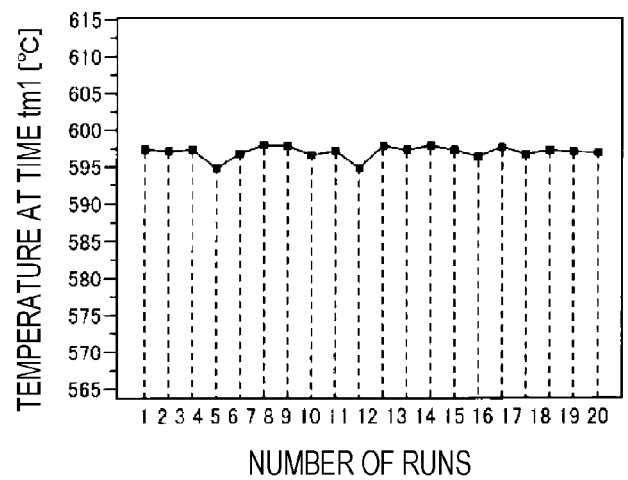

FIGS. 11A and 11B are views illustrating temperature reproducibility of the first heat treatment by the heat treatment apparatus having the first partitions 70 and 72. FIG. 11A is a graph which illustrates a change over time in the measured temperature in the area CB in the space S, and time is illustrated on the horizontal axis, and temperature [□] is illustrated on the vertical axis. FIG. 11B is a graph which illustrates a change over each run in the measured temperature at time tm1 in FIG. 11A, and the number of runs is illustrated on the horizontal axis, and temperature [□] at time tm1 is illustrated on the vertical axis. Further, a plurality of solid lines in FIG. 11A illustrate the result for each run.

As illustrated in FIGS. 11A and 11B, when the first heat treatment is performed using the heat treatment apparatus having the first partitions 70 and 72, it can be seen that the temperature fluctuation hardly occurs at each run in the carry-in step. Meanwhile, as illustrated in FIG. 11A, it can be seen that the temperature fluctuation slightly occurs at each run after the carry-in step (see the circle indicated by broken lines).

Figure 12A:
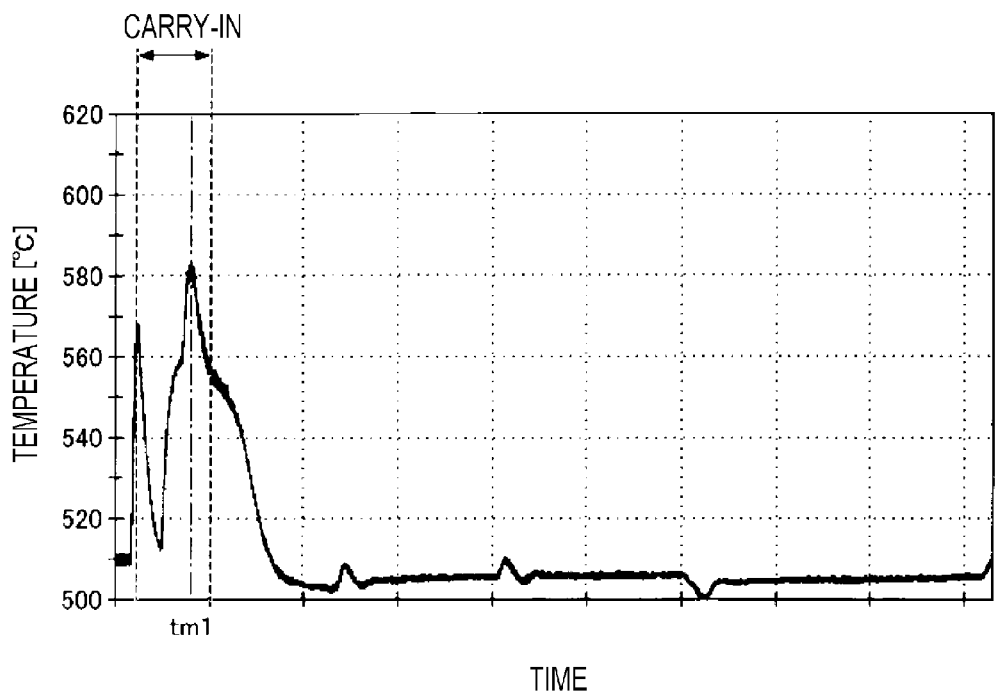
FIGS. 12A and 12B are views illustrating temperature reproducibility of the first heat treatment by a heat treatment apparatus having a first partition and a second partition.
Figure 12B:
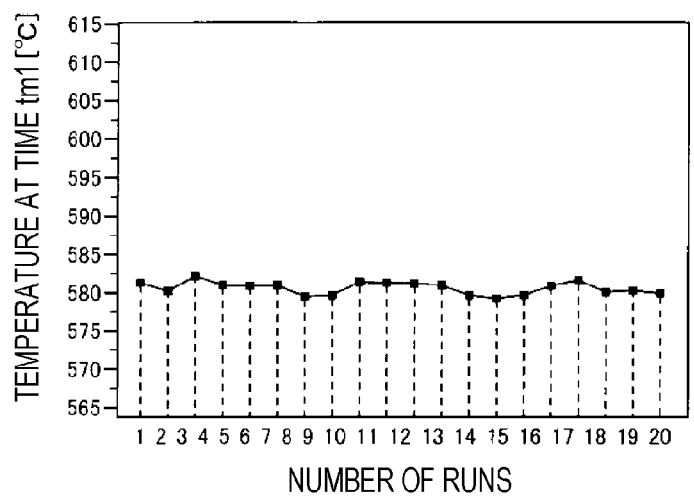

FIGS. 12A and 12B are views illustrating temperature reproducibility of the first heat treatment by the heat treatment apparatus having the first partitions 70 and 72 and the second partition 80. FIG. 12A is a graph which illustrates a change over time in the measured temperature in the area CB in the space S, and time is illustrated on the horizontal axis, and temperature [□] is illustrated on the vertical axis. FIG. 12B is a graph which illustrates a change over each run in the measured temperature at time tm1 in FIG. 12A, and the number of runs is illustrated on the horizontal axis, and temperature [□] at time tm1 is illustrated on the vertical axis. Further, a plurality of solid lines in FIG. 12A illustrate the result for each run.

As illustrated in FIGS. 12A and 12B, when the first heat treatment is performed using the heat treatment apparatus having the first partitions 70 and 72 and the second partition 80, it can be seen that the temperature fluctuation hardly occurs at each run, in all steps.

From the above results, it can be said that, in the first heat treatment performed at the constant temperature, the temperature reproducibility in the carry-in step may be improved by providing the first partitions 70 and 72 in the space S. Further, it can be said that, in the first heat treatment performed at the constant temperature, the temperature reproducibility in all steps may be improved by providing the second partition 80 in the space S in addition to the first partitions 70 and 72.

Example 2

In Example 2, evaluation is made on temperature fluctuation when a second heat treatment accompanied by a change in temperature is repeatedly performed by 20 runs. The heat treatment apparatuses used in Example 2 include a heat treatment apparatus which does not have the first partitions 70 and 72 and the second partition 80, a heat treatment apparatus which has the first partitions 70 and 72, and a heat treatment apparatus which has the first partitions 70 and 72 and the second partition 80.

Figure 13:
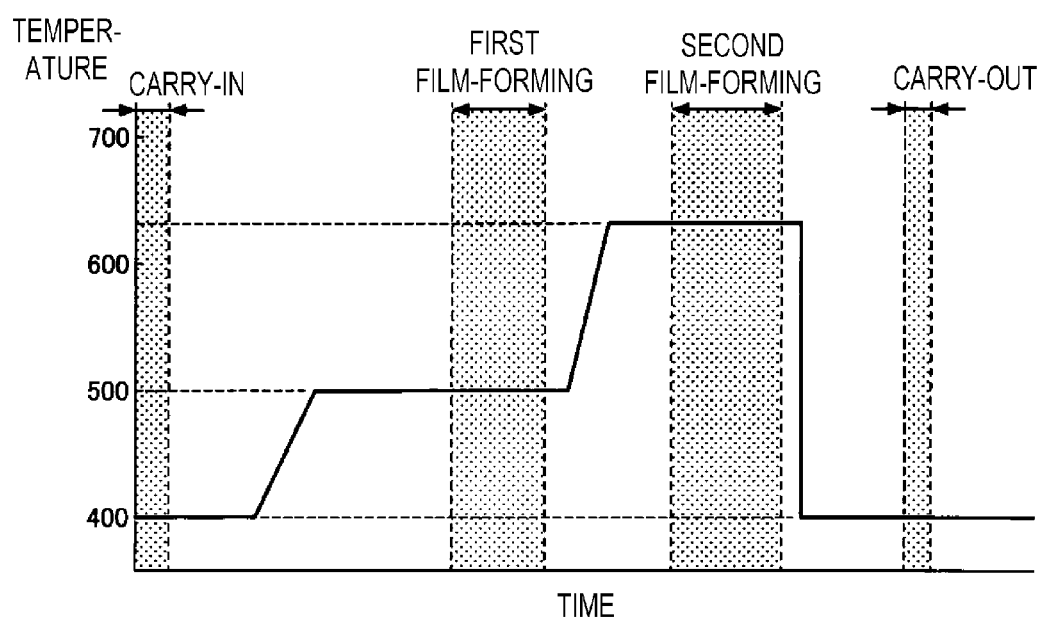
FIG. 13 is a view illustrating a change over time in a set temperature of a second heat treatment accompanied by a change in temperature.

FIG. 13 is a view illustrating a change over time in a set temperature of the second heat treatment accompanied by a change in temperature. In FIG. 13, time is illustrated on the horizontal axis, and temperature [□] is illustrated on the vertical axis. As illustrated in FIG. 13, in Example 2, the set temperature in the carry-in step in which the wafer W is carried into the processing container 4 is set to 400□.

Further, the set temperature in the first film-forming step in which the film-forming is performed on the wafer W is set to 500□. Further, the set temperature in the second film-forming step in which the film-forming is performed on the wafer W is set to 630□. Further, the set temperature in the carry-out step in which the wafer W is carried out from the processing container 4 is set to 400□.

Figure 14A:
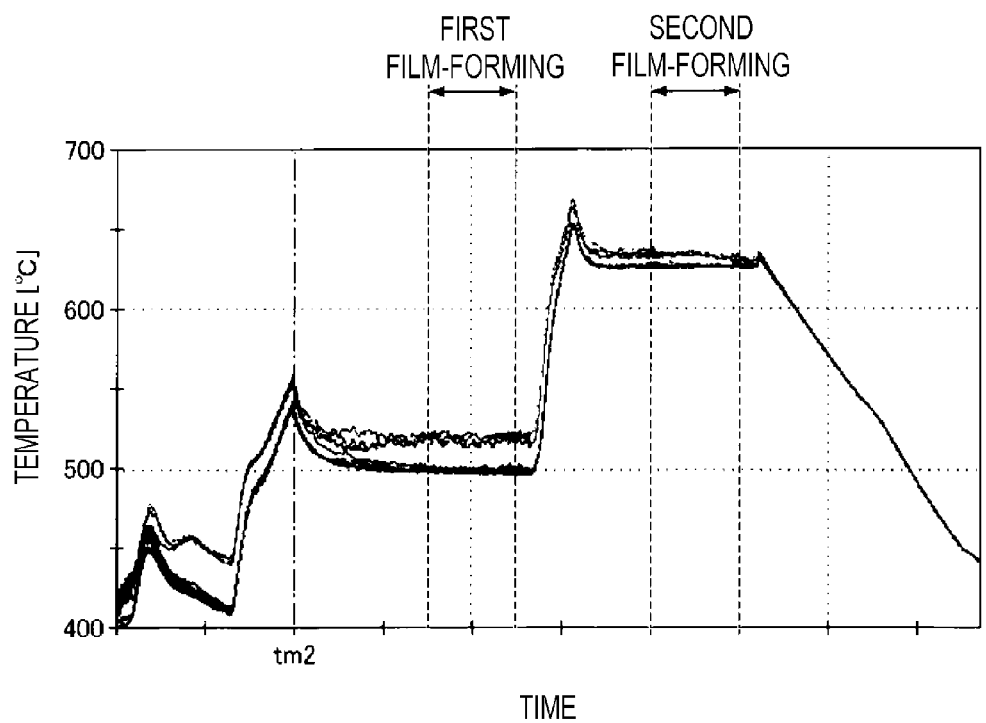
FIGS. 14A and 14B are views illustrating temperature reproducibility of the second heat treatment by the heat treatment apparatus of the related art.
Figure 14B:
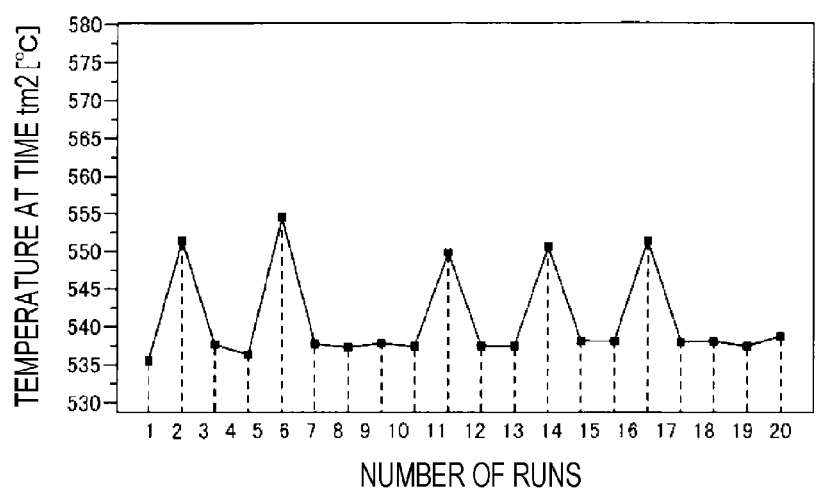

FIGS. 14A and 14B are views illustrating temperature reproducibility of the second heat treatment by the heat treatment apparatus of the related art. FIG. 14A is a graph which illustrates a change over time in the measured temperature in the area CB in the space S, and time is illustrated on the horizontal axis, and temperature [□] is illustrated on the vertical axis. FIG. 14B is a graph which illustrates a change over each run in the measured temperature at time tm2 in FIG. 14A, and the number of runs is illustrated on the horizontal axis, and temperature [□] at time tm2 is illustrated on the vertical axis. Further, a plurality of solid lines in FIG. 14A illustrate the result for each run.

As illustrated in FIG. 14A, when the second heat treatment is performed using the heat treatment apparatus of the related art, it can be seen that the temperature fluctuation occurs at each run in all steps including the first film-forming step and the second film-forming step. Further, as illustrated in FIG. 14B, when the second heat treatment is performed using the heat treatment apparatus of the related art, it can be seen that the temperature at time tm2 that is immediately after the temperature rise before the first film-forming step fluctuates largely at each run, so that the temperature reproducibility of the heat treatment is poor.

Figure 15A:
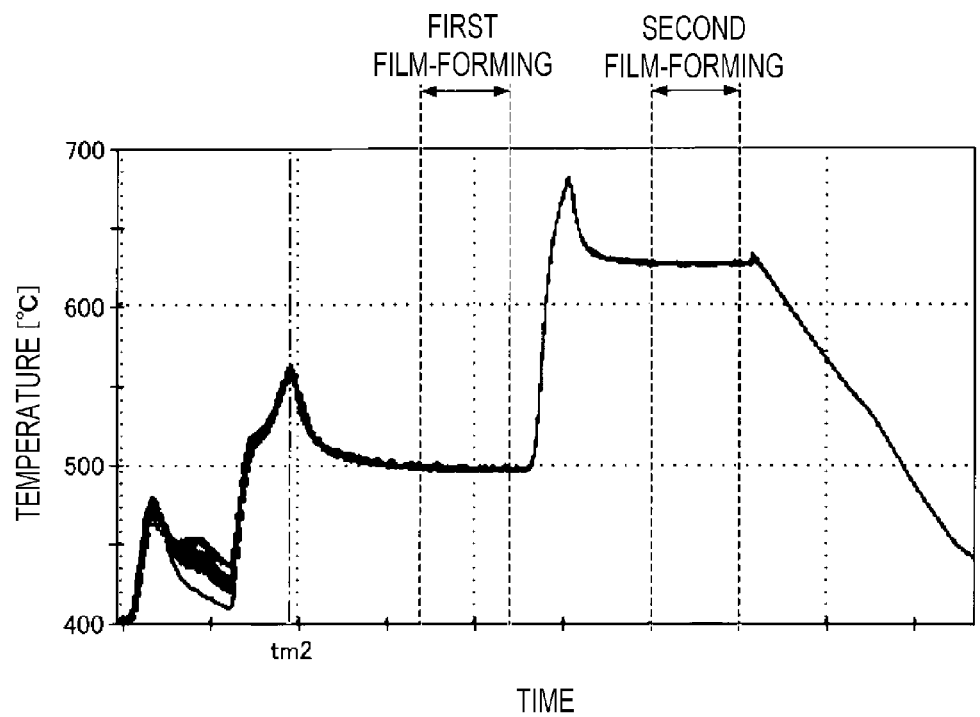
FIGS. 15A and 15B are views illustrating temperature reproducibility of the second heat treatment by the heat treatment apparatus having the first partition.
Figure 15B:
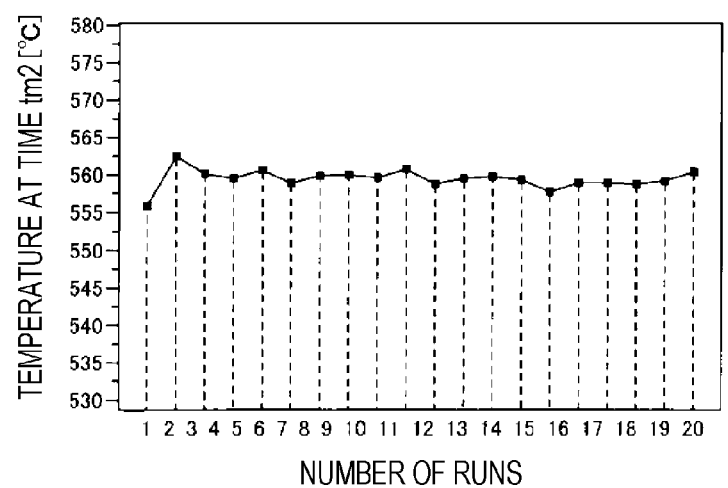

FIGS. 15A and 15B are views illustrating temperature reproducibility of the second heat treatment by the heat treatment apparatus having the first partitions 70 and 72. FIG. 15A is a graph which illustrates a change over time in the measured temperature in the area CB in the space S, and time is illustrated on the horizontal axis, and temperature [□] is illustrated on the vertical axis. FIG. 15B is a graph which illustrates a change over each run in the measured temperature at time tm2 in FIG. 15A, and the number of runs is illustrated on the horizontal axis, and temperature [□] at time tm2 is illustrated on the vertical axis. Further, a plurality of solid lines in FIG. 15A illustrate the result for each run.

As illustrated in FIGS. 15A and 15B, when the second heat treatment is performed using the heat treatment apparatus having the first partitions 70 and 72, it can be seen that, in all steps, the temperature fluctuation at each run becomes smaller than the case where the heat treatment apparatus of the related art is used.

Figure 16A:
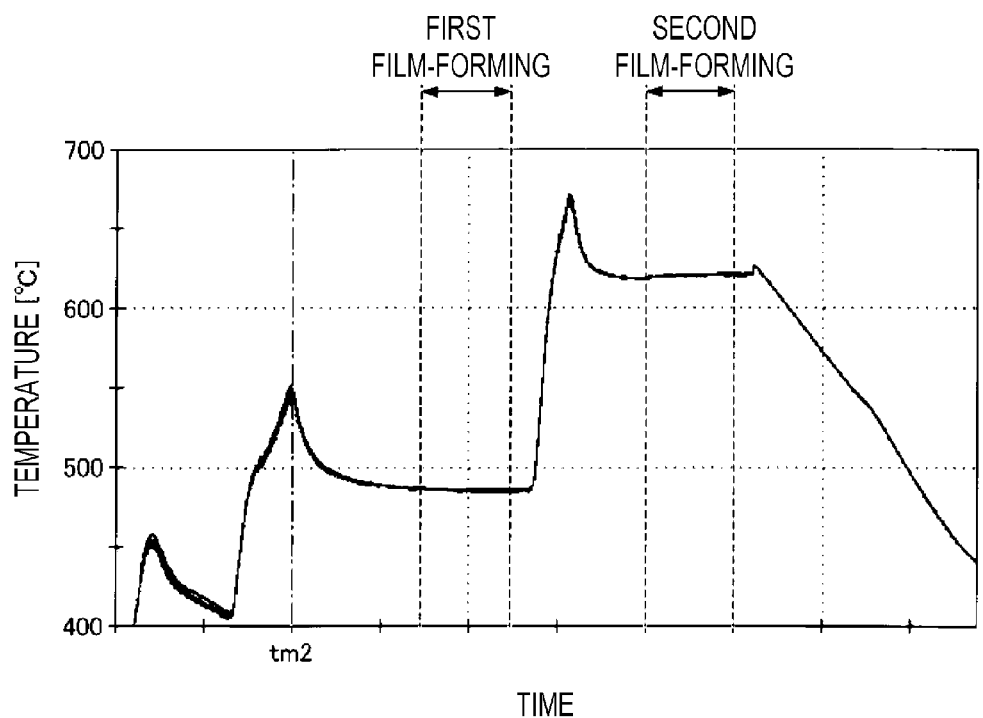
FIGS. 16A and 16B are views illustrating temperature reproducibility of the second heat treatment by the heat treatment apparatus having the first partition and the second partition.
Figure 16B:
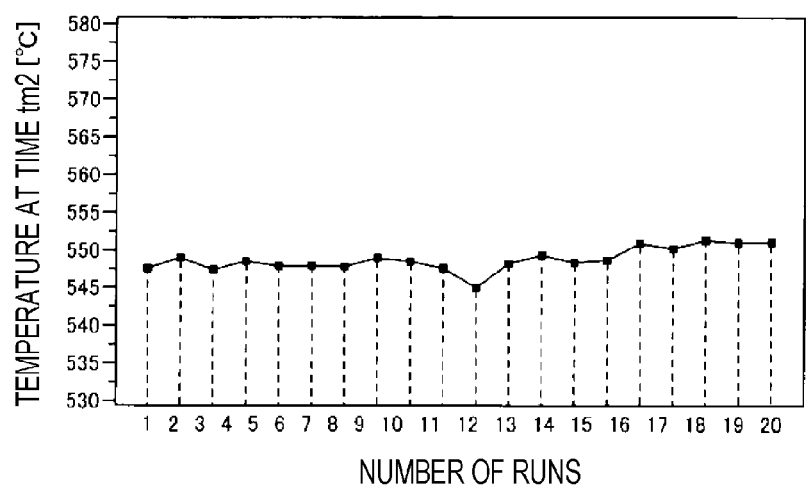

FIGS. 16A and 16B are views illustrating temperature reproducibility of the second heat treatment by the heat treatment apparatus having the first partitions 70 and 72 and the second partition 80. FIG. 16A is a graph which illustrates a change over time in the measured temperature in the area CB in the space S, and time is illustrated on the horizontal axis, and temperature [□] is illustrated on the vertical axis. FIG. 16B is a graph which illustrates a change over each run in the measured temperature at time tm2 in FIG. 16A, and the number of runs is illustrated on the horizontal axis, and temperature [□] at time tm2 is illustrated on the vertical axis. Further, a plurality of solid lines in FIG. 16A illustrate the result for each run.

As illustrated in FIGS. 16A and 16B, when the second heat treatment is performed using the heat treatment apparatus having the first partitions 70 and 72 and the second partition 80, it can be seen that the temperature fluctuation hardly occurs at each run, in all steps.

From the above results, it can be said that the temperature reproducibility at the second heat treatment accompanied by a change in temperature may be improved by providing the first partitions 70 and 72 in the space S. Further, it can be said that the temperature reproducibility at the second heat treatment accompanied by a change in temperature may be improved by providing the second partition 80 in the space S in addition to the first partitions 70 and 72.

According to the present disclosure, the temperature reproducibility at the heat treatment may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus comprising:
a processing container extended in a vertical direction;
a heater provided around the processing container;
a temperature sensor provided along a longitudinal direction of the processing container either in the processing container or in a space between the processing container and the heater; and
a pair of first partitions provided in the space facing each other across a half line that extends from a central axis of the processing container and passes through the temperature sensor, and extending along the longitudinal direction of the processing container,
wherein the heater includes:
a heat insulator that covers an outer circumference of the processing container,
a heater element provided inside the heat insulator, and
a holder that is attached to an inner surface of the heat insulator and holds the heater element, and
wherein one of the first partitions is detachably attached to the heater element or the holder.

2. The heat treatment apparatus according to claim 1, wherein the temperature sensor includes a plurality of temperature gauges along the longitudinal direction of the processing container, and
an upper end of one of the first partitions is positioned above an uppermost temperature gauge among the plurality of temperature gauges.

3. The heat treatment apparatus according to claim 1, wherein each of the first partitions is divided into a plurality of portions.

4. The heat treatment apparatus according to claim 1, wherein each of the first partitions is provided with a gap with respect to an outer surface of the processing container.

5. The heat treatment apparatus according to claim 1, wherein each of the first partitions is made of a ceramic material.

6. The heat treatment apparatus according to claim 1, further comprising:
a second partition provided in the space and extending along a circumferential direction of the processing container.

7. The heat treatment apparatus according to claim 6, wherein the second partition includes a circular arc plate-like portion equal to or larger than a semicircle and extending along the circumferential direction of the processing container from one of the first partitions to a remaining one of the first partitions.

8. The heat treatment apparatus according to claim 7, wherein the second partition includes a circular arc plate-like portion smaller than a semicircle and extending along the circumferential direction of the processing container from one of the first partitions to a remaining one of the first partitions.

9. The heat treatment apparatus according to claim 6, further comprising:
one or a plurality of third partitions provided on the same circumference as the pair of first partitions at an interval from the pair of first partitions, and extending along the longitudinal direction of the processing container,
wherein the second partition includes a plurality of circular arc plate-like portions extending along the circumferential direction of the processing container to connect the pair of first partitions and the third partition.

10. The heat treatment apparatus according to claim 6, wherein the heater is divided into a plurality of heating areas that are individually controllable in the longitudinal direction of the processing container, and
the second partition is provided at or in the vicinity of a boundary between a lowermost heating area among the plurality of heating areas and a heating area adjacent above the lowermost heating area.

11. The heat treatment apparatus according to claim 6, wherein the heater is divided into a plurality of heating areas that are individually controllable in the longitudinal direction of the processing container, and
a plurality of second partitions is provided corresponding to each boundary of the plurality of heating areas or to the vicinity of the boundary.

12. The heat treatment apparatus according to claim 6, wherein the second partition is divided into a plurality of portions.

13. The heat treatment apparatus according to claim 6, wherein the heater includes:
a heat insulator that covers an outer circumference of the processing container;
a sub-heater provided inside the heat insulator; and
a holder that is attached to an inner surface of the heat insulator and holds the sub-heater, and
the second partition is detachably attached to the sub-heater or the holder.

14. The heat treatment apparatus according to claim 6, wherein the second partition is provided with a gap with respect to an outer surface of the processing container.

15. The heat treatment apparatus according to claim 6, wherein the second partition is made of a ceramic material.

* * * * *